(12) United States Patent
Crankshaw et al.

(10) Patent No.: US 9,006,715 B2
(45) Date of Patent: Apr. 14, 2015

(54) ELECTRONIC DEVICE

(75) Inventors: Mark Crankshaw, Royston (GB); Mark Dowling, Elsworth (GB); Daniel Forsythe, Cambridge (GB); Simon Goddard, Impington (GB); Gary Williams, Huntingdon (GB); Ilaria Grizzi, Cambridge (GB); Angela McConnell, Impington (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 154 days.

(21) Appl. No.: 13/512,153

(22) PCT Filed: Dec. 6, 2010

(86) PCT No.: PCT/GB2010/002235
§ 371 (c)(1),
(2), (4) Date: Sep. 12, 2012

(87) PCT Pub. No.: WO2011/070316
PCT Pub. Date: Jun. 16, 2011

(65) Prior Publication Data
US 2013/0001594 A1 Jan. 3, 2013

(30) Foreign Application Priority Data
Dec. 11, 2009 (GB) .................................. 0921707.6

(51) Int. Cl.
*H01L 51/00* (2006.01)
*H01L 27/32* (2006.01)

(52) U.S. Cl.
CPC ........ *H01L 27/3283* (2013.01); *H01L 27/3246* (2013.01)

(58) Field of Classification Search
USPC ............ 257/40, 643, 759, E51.002, E51.021, 257/E25.009; 438/69, 82, 99, 478
See application file for complete search history.

(56) References Cited

U.S. PATENT DOCUMENTS

2005/0112341 A1   5/2005   Ito et al.
2008/0030119 A1*  2/2008   Ito et al. ........................ 313/483
(Continued)

FOREIGN PATENT DOCUMENTS

| GB | 2 455 747 A | 6/2009 |
| WO | WO-2006/049595 A1 | 5/2006 |
| WO | WO-2009/077738 A1 | 6/2009 |

OTHER PUBLICATIONS

Combined Search and Examination Report for Application No. GB0921707.6, dated Apr. 16, 2010.
(Continued)

*Primary Examiner* — Su C Kim
(74) *Attorney, Agent, or Firm* — Marshall, Gerstein & Borun LLP

(57) ABSTRACT

A method of making an electronic device comprising a double bank well-defining structure, which method comprises: providing an electronic substrate; depositing a first insulating material on the substrate to form a first insulating layer; depositing a second insulating material on the first insulating layer to form a second insulating layer; removing a portion of the second insulating layer to expose a portion of the first insulating layer and form a second well-defining bank; depositing a resist on the second insulating layer and on a portion of the exposed first insulating layer; removing the portion of the first insulating layer not covered by the resist, to expose a portion of the electronic substrate and form a first well-defining bank within the second well-defining bank; and removing the resist. The method can provide devices with reduced leakage currents.

11 Claims, 6 Drawing Sheets

(56) References Cited

U.S. PATENT DOCUMENTS

| | | |
|---|---|---|
| 2008/0067506 A1 | 3/2008 | Takei et al. |
| 2008/0211395 A1* | 9/2008 | Koshihara et al. ............ 313/504 |
| 2008/0230772 A1 | 9/2008 | Kamiura et al. |
| 2009/0026467 A1* | 1/2009 | Yanagihara .................... 257/88 |

OTHER PUBLICATIONS

International Preliminary Report on Patentability for Application No. PCT/GB2010/002235, dated Jun. 12, 2012.

International Search Report and Written Opinion for Application No. PCT/GB2010/002235, dated Sep. 8, 2011.

* cited by examiner

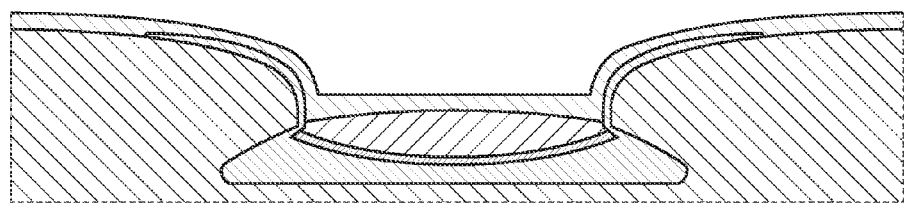
Exposed PEDOT
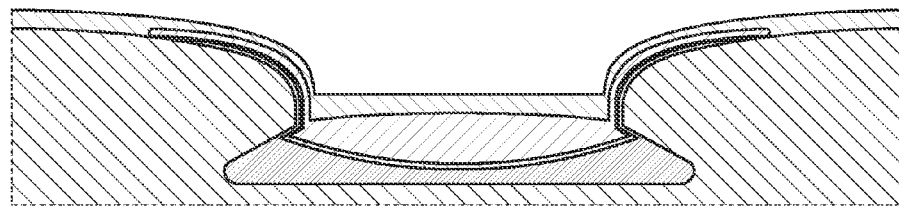
Thin device stack on bank
Fig. 2

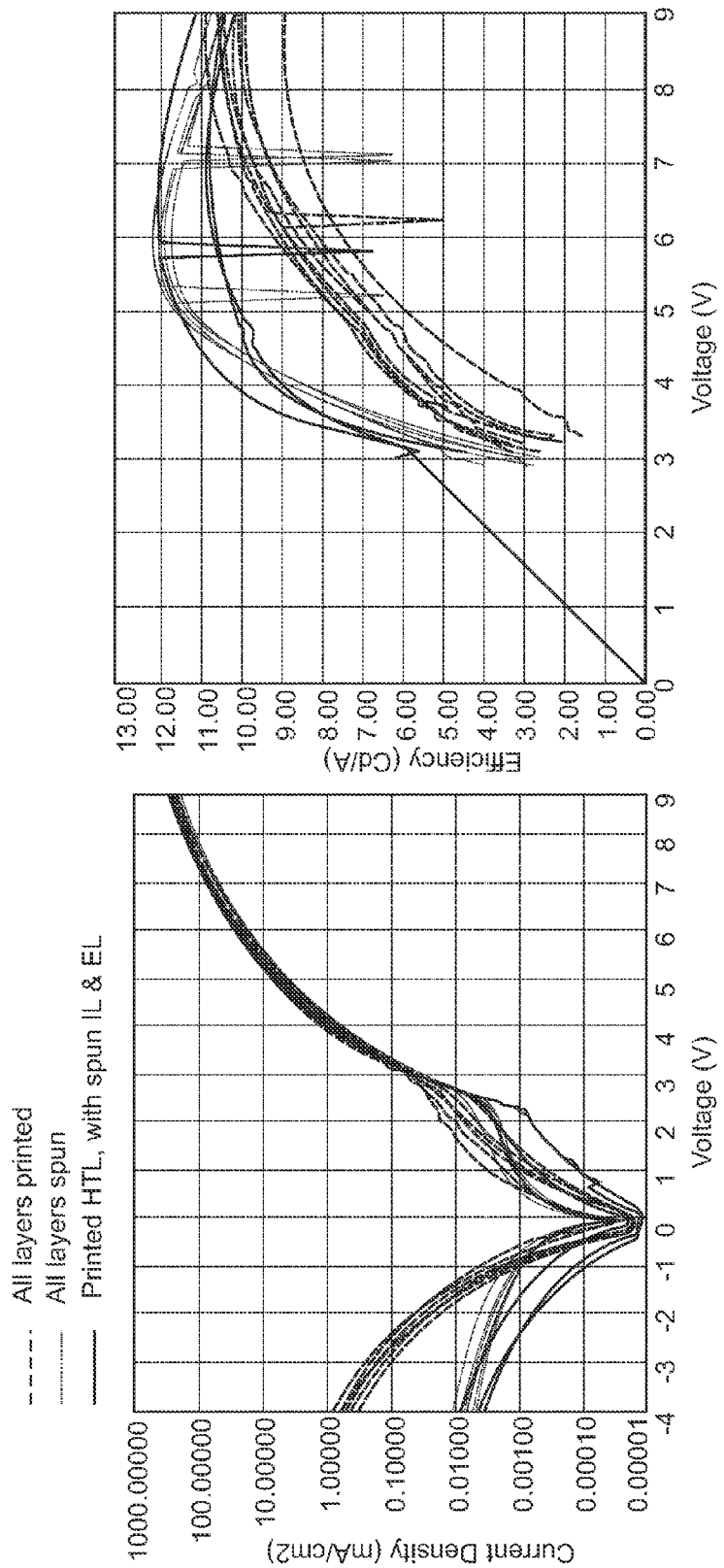

ELECTRONIC DEVICE

BACKGROUND OF THE INVENTION

1. Field of the Invention

The present invention relates to methods of making electronic devices and the electronic devices themselves. The invention additionally relates to electronic devices obtainable by the methods of the invention. The devices and methods of the present invention are particularly advantageous, since electrical leakage from the cathode on top of the device stack to the hole injection layer is minimised or eliminated.

2. Related Technology

Methods for manufacturing electronic devices involving the deposition of active components from solution (solution processing) have been extensively investigated. If active components are deposited from solution, one problem is how to contain the active components in desired areas of the substrate. One solution to this problem is to provide a substrate comprising a patterned bank layer defining wells in which the active components can be deposited from solution. The wells contain the solution while it is drying, such that the active components remain in the areas of the substrate defined by the wells.

These methods have been found to be particularly useful for deposition of organic materials from solution. The organic materials may be conductive, semi-conductive, and/or opto-electronically active, such that they can emit light when an electric current is passed through them or detect light by generating a current when light impinges upon them. Devices which utilize these materials are known as organic electronic devices. An example is an organic transistor device. If the organic material is a light-emissive material, the device is known as an organic light-emissive device (OLED).

Thin film transistors (TFTs), and in particular organic thin film transistors (OTFTs) may be manufactured by low cost, low temperature methods such as solution processing. In these devices, it is particularly important to contain the organic semiconductor (OSC) within the right areas and channels of the device. It is known to provide a bank which defines wells in order to contain the OSC. However, even when using such a well-defining bank, wetting of the bank layer may occur if the contact angle of the OSC solution on the bank is too low. It is also known to control the wettability of the bank by coating with a fluorine based plasma. Other methods include using material with inherently low wettability.

Some devices may require more than a single OSC layer. A typical organic light emitting device (OLED), such as one used in a display, may have two layers of organic semiconductor material—one may be a layer of light emitting material, such as a light-emitting polymer (LEP), and the other may be a layer of a hole transporting material, such as a polythiophene derivative or a polyaniline derivative. In certain circumstances it is an advantage to form a double bank structure such that the first and second bank layers define a step structure around the wells formed by the banks. Such a structure can allow the wells to be overfilled with solution. Such dual bank systems exist with 2 layers, or steps, but the lower/inner bank has typically not been included as a separate pinning/filling point for the first layer of organic semiconductor material. In other systems the lower/inner bank may act as a mask (to mask off edge emission effects), or as a means to improve fluid wetting around the edge of the filled area, but the whole area (up to the upper/outer bank edge) is filled (or intended to be filled) by all organic semiconductor layers, and they share the same pinning point.

WO 2009/077738 discloses a double bank structure providing two different pinning points for different fluids deposited in the wells, one at the edge of the first layer around the well and one at an edge of the second layer stepped back from the well. This can ensure, for example, that on drying a second material deposited in the wells completely covers a first material, particularly around the edges of the wells.

SUMMARY OF THE INVENTION

It is desirable to improve the double bank arrangement. It is also desirable to develop an improved process for the production of devices using the double bank arrangement. The present invention can mitigate the problems associated with the prior art, and can provide improved devices incorporating the double bank technology, as well as improved methods for manufacturing such devices.

According to a first aspect of the present invention, there is provided a method as for the manufacture of an electronic device comprising a double bank well-defining structure.

In one example, the method comprises
 (a) providing an electronic substrate;
 (b) depositing a first insulating material on the substrate to form a first insulating layer;
 (c) depositing a second insulating material on the first insulating layer to form a second insulating layer;
 (d) removing a portion of the second insulating layer to expose a portion of the first insulating layer and form a second well-defining bank;
 (e) depositing a resist on the second insulating layer and on a portion of the exposed first insulating layer;
 (f) removing the portion of the first insulating layer not covered by the resist, to expose a portion of the electronic substrate and form a first well-defining bank within the second well-defining bank;
 (g) removing the resist.

Instead of a single bank, this invention uses a dual bank consisting of an 'inner' bank (the first bank, or lower bank) whose edge is set inside an 'outer' bank (the second bank, or upper bank). A key point of the invention is that through the choice of materials and processing of the bank, treatment of the substrate, and the selective ink deposition process (such as, for example, nozzle printing, or any ink jet printing methods such as, but not limited to, drop on demand, continuous drop), it is arranged that the different fluids can be pinned to, and contained within, the two banks separately.

In principle, any substances may be used for the various layers, provided that the electronic substrate is not exposed until the step (g). Preferably the second insulating layer has lower wettability than the first insulating layer. This feature aids the device in providing two different pinning points for two different fluids deposited in the wells. Typically, but not exclusively, the second insulating layer has a contact angle of 80° or greater, whilst the first insulating layer has a contact angle of 100° or greater.

The invention further provides an electronic device obtainable by the method as defined above.

According to a second aspect of the present invention, there is provided an electronic device.

In one example, the electronic device comprises: an electronic substrate comprising circuit elements; a double bank well-defining structure disposed over the electronic substrate, the double bank well-defining structure comprising a first layer of insulating material and a second layer of insulating material thereover, the second layer of insulating material having a lower wettability than the first layer of insulating material; a first layer of organic semiconductive material disposed within the first well; and a second layer of organic semiconductive material disposed over the first layer and within the second well; wherein the profile of the first well and second well are different and one and only one of the first and second wells has a straight profile.

The electronic device can be an organic thin film transistor and the circuit elements of the electronic substrate comprise source and drain electrodes over which the double bank structure is disposed with a channel region defined between the source and drain electrodes.

BRIEF DESCRIPTION OF THE DRAWINGS

The invention will now be described by way of example only, with reference to the accompanying schematic drawings, in which:

FIG. 2 shows a cross-section of a conventional single bank substrate when made into a device; the cathode may either make direct contact with the hole injection layer (HIL) on the bank (top), have a very thin device stack on the bank (bottom), or a point contact at the pinning point. All of these lead to either an electrical leakage path, or a short circuit, between the electrodes;

FIGS. 3a and 3b show results for the devices of FIG. 2. The JV curves (FIG. 3a) for the fully printed device (dashed lines) show high leakage (high current when reverse driven (e.g. at −4V) and before turn-on (e.g. at 1V)). With spun interlayer (IL) and electroluminescent layer (EL) (dotted lines), leakage is much lower as the HIL is fully covered by the spun films on top. The efficiency curves (FIG. 3b) reflect this with the fully printed case (continuous lines) showing much lower efficiency;

DETAILED DESCRIPTION

An important aspect of making the dual bank, dual pinning point structure and method of the present invention more effective, is in producing suitable fluid contact angles (suitable surface energies) for the relevant fluids on the anode material (e.g. indium tin oxide—ITO), inner and outer banks. For example, the hole injecting layer (HIL) must wet the substrate (e.g. ITO), but not the inner bank so as to be contained by the inner bank, but the IL must wet the inner bank but not the outer bank so as to fill out to, but be contained by, the outer bank.

This has been achieved both by the choice of materials for the two banks, and in the process sequence used to pattern them. The material for the inner bank (the first insulating layer) is formed from an epoxy based negative tone photo-resist because it gives a high contact angle with the used HIL, but a low contact angle with the IL. Two outer bank (second insulating layer) systems have so far proved successful—a commercially available negative tone photo-resist with a fluorinated additive (post-mixed), and a fluorinated positive tone bank material, where a fluorinated species is added to the polymer during bank formulation (pre-mixed), as these both produce high contact angles with IL and LEP inks.

Figure 1:
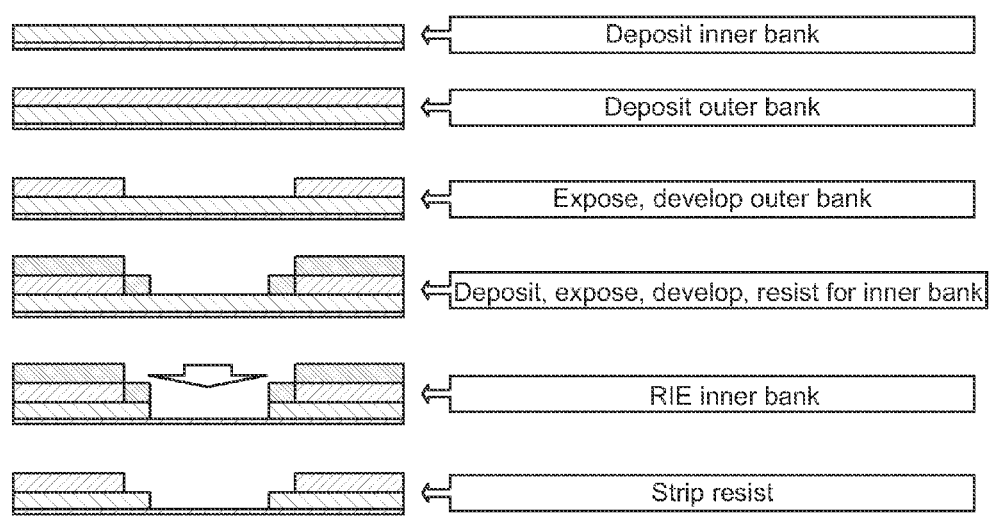
FIG. 1 shows an exemplary schematic method of the present invention: the inner bank material is patterned after the curing stage of the outer bank in order to ensure that the indium tin oxide (ITO) anode remains unexposed.
Figures 4A, 4B:
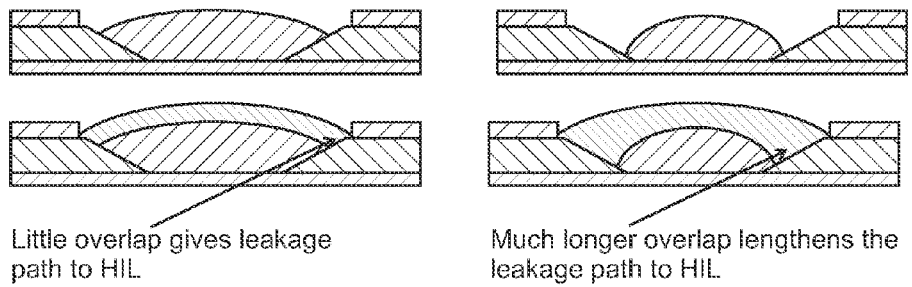
FIGS. 4a and 4b show a comparison between a dual bank arrangement with a single pinning point (FIG. 4a) and a dual bank arrangement with dual pinning points (FIG. 4b)
Figure 5:
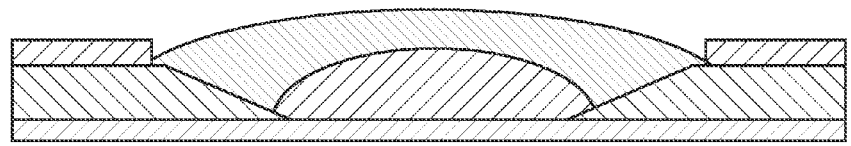
FIG. 5 shows an enlarged schematic of a dual bank arrangement with dual pinning points.

Key problem issues in the processing of dual banks have been in retaining a very low contact angle on ITO with HIL and in keeping the high contact angle for the epoxy based negative tone photo-resist for HIL, but low for IL. A novel process has been developed to achieve this whereby the patterning of the inner bank is the final step (see FIG. 1).

The above patterning process has the following advantages. By patterning the outer bank over a planar/cured inner bank material, the ITO (anode) remains unexposed during the curing stage of the outer bank. As the curing stage can cause contamination of ITO and render it non-wetting to fluid and inner pixel patterned last approach can leave the ITO very clean.

ITO wetting is an issue for ink jetting processes and the ability to keep the ITO hydrophilic typically requires rinse treatments or exposure to UV-Ozone in other bank systems. Treatments of ITO also impact the hydrophobic banks that surround them and leave them less hydrophobic and therefore less capable as an outer bank.

By patterning the pre-cured inner bank using dry etching (such as reactive ion etching (RIE) or oxygen- plasma etching, after the outer bank patterning and curing are complete, the ITO is very wetting for a number of days. This is because the ITO exposure to oxygen-plasma renders it very wetting to typical HIL fluids and, as the outer bank is already fully processed, the potential fluorinated-species and hydro-carbon contaminates can be significantly reduced or eliminated. In addition to keeping the ITO clean and wetting using the principles of this invention, considerable improvements have been made in keeping the inner bank hydrophobic to HIL. This has been achieved by developing (i.e., wet etching) rather than using dry etching (RIE patterning). Success has also been achieved in keeping this layer wetting for IL, by reducing cross contamination—lower fluorinated-species content and rinses, overdeveloping and prebakes and rinses, etc.

Figure 6A:
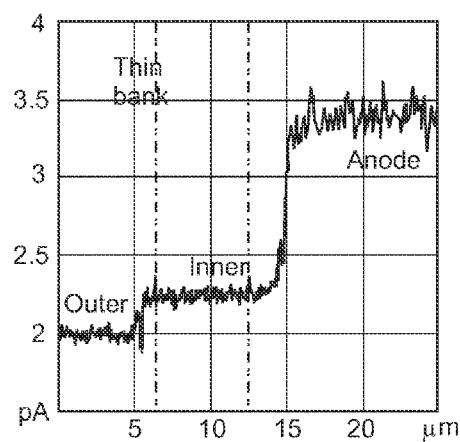
FIGS. 6a and 6b show tunnelling AFM (TUNA) current traces for thin inner bank and thick inner bank devices, respectively.
Figure 6B:
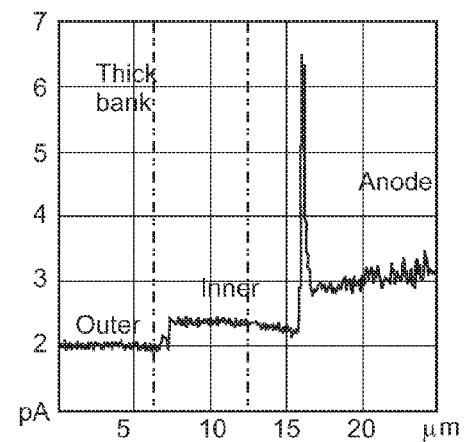
Figure 7:
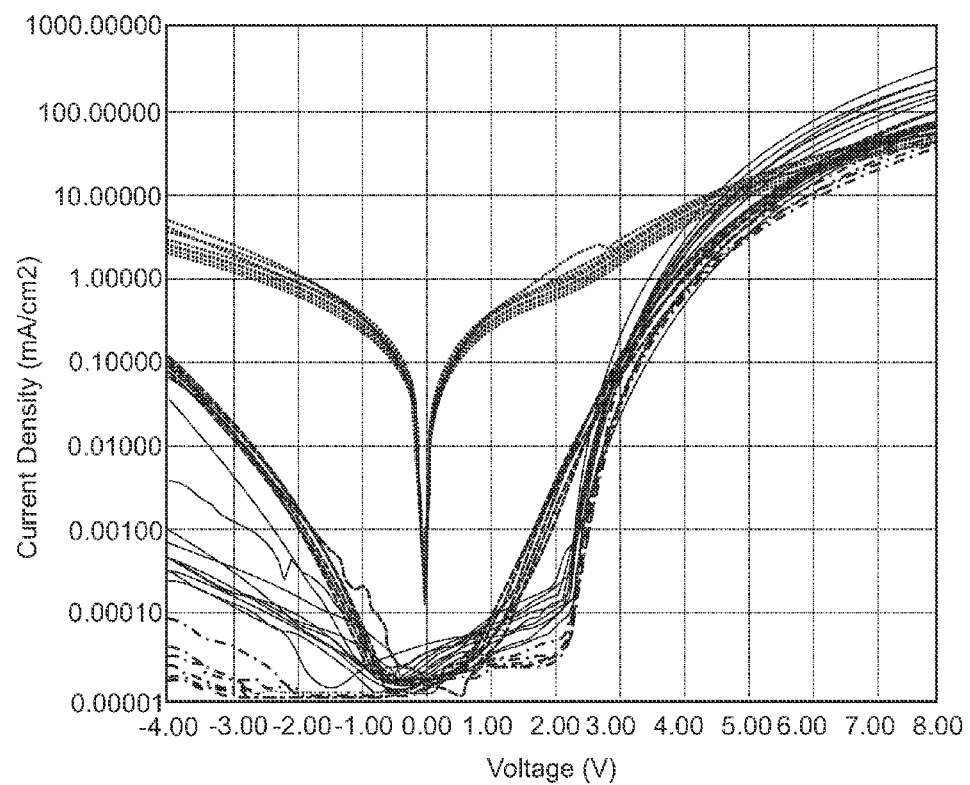
FIG. 7 shows device results from OLED devices produced using dual bank substrates. Either a single pinning point (the outer bank) was used for all layers or the new method with different pinning points for HIL (inner bank) and interlayer/light emitting polymer (IL/LEP) (outer bank). The curves for a single pinning point devices show a high forward and reverse leakage current (dotted lines) due to the single pinning point. An alternative approach to reducing leakage with a single pinning point is to use a HIL with a higher resistivity to reduce the leakage current, and while this does help (dashed lines), leakage is still present. In contrast, the different pinning point devices (continuous and dashed-dotted lines) show much lower leakage (note log scale—2 or 3 orders of magnitude lower in reverse bias). This shows that the dual bank alone does not reduce leakage—it is the use of the different pinning point method, in turn enabled by dual banks which allow that, which produce the low leakage devices.

In a single pinned arrangement, images from tunnelling AFM clearly show significant leakage from the anode through the HIL over the inner bank, which is not present in the dual pinned case. FIG. 6a shows tunnelling AFT current traces of devices having a thin (under 200 nm vertical thickness) inner bank. This trace shows no leakage path at the interface between the anode and the inner bank for the dual pinned case. On the other hand, FIG. 6b shows tunnelling AFM current traces for thicker inner bank material (vertical thickness above 200 nm), highlighting a leakage path between the anode and the inner bank.

Many modifications and variations can be made to the above exemplary method and devices whilst falling within the scope of the invention as defined by the claims.

The invention claimed is:

1. An electronic device comprising: an electronic substrate comprising circuit elements; a double bank well-defining structure disposed over the electronic substrate, the double bank well-defining structure comprising a first layer of insulating material defining a first well and a second layer of insulating material overlying the first layer and defining a second well, the second layer of insulating material having a lower wettability than the first layer of insulating material; a first layer of organic semiconductive material disposed within the first well; and a second layer of organic semiconductive material disposed over the first layer and within the second well, wherein the bank of the first well is hydrophobic to a solution comprising a hole injection layer.

2. An electronic device according to claim 1 wherein the first and second wells have different profiles.

3. An electronic device according to claim 1, having different pinning points for the first and second layers of organic semiconductive materials.

4. An electronic device according to claim 1, wherein the first layer of organic semiconductive material is a hole injection layer (HIL).

5. An electronic device according to claim 1, wherein the electronic device is an organic thin film transistor and the circuit elements of the electronic substrate comprise source and drain electrodes over which the double bank structure is disposed with a channel region defined between the source and drain electrodes.

6. An electronic device according to claim 1, wherein the electronic device is an organic light emissive device and the circuit elements of the electronic substrate comprise a lower electrode of the organic light emissive device.

7. An electronic device according to claim 1, wherein the first insulating layer is formed from an epoxy-based negative photo-resist.

8. An electronic device according to claim 1, wherein the second insulating layer is formed from either a negative photo-resist with a fluorinated additive, or a fluorinated positive photo-resist.

9. An electronic device according to claim 1, wherein the second insulating layer has a contact angle of 80° or greater.

10. An electronic device according to claim 1, wherein the first insulating layer has a contact angle of 100° or greater.

11. An electronic device according to claim 1, wherein the second organic semiconductive material is selected from the group consisting of an interlayer (IL) and a light emissive polymer (LEP).

* * * * *